United States Patent [19]

Yamazaki et al.

[11] Patent Number: 5,168,225
[45] Date of Patent: Dec. 1, 1992

[54] METHOD OF ANALYZING 3D NMR SPECTRUM

[75] Inventors: Toshio Yamazaki; Kuniaki Nagayama, both of Tokyo, Japan

[73] Assignee: JEOL Ltd., Tokyo, Japan

[21] Appl. No.: 633,937

[22] Filed: Dec. 26, 1990

[30] Foreign Application Priority Data

Dec. 25, 1989 [JP] Japan .................. 1-335750

[51] Int. Cl.⁵ .............................................. G01V 3/00
[52] U.S. Cl. .................................... 324/307; 324/300
[58] Field of Search ................ 364/498, 485; 324/300, 324/307, 309, 312

[56] References Cited

U.S. PATENT DOCUMENTS 4,134,058  1/1979  Ernst ....................... 324/300
4,807,148  2/1989  Lacey ..................... 364/498

OTHER PUBLICATIONS

"3D NMR and Global Fold Determination of Ribonuclease H from *E. coli* with a 400 MHz NMR System", by Nagayama et al., JEOL News, vol. 27A, No. 1, (1991), pp. 2-7.

*Primary Examiner*—Louis Arana
*Attorney, Agent, or Firm*—Webb, Burden, Ziesenheim & Webb

[57] ABSTRACT

There is disclosed a method of symmetrizing a three-dimensional NMR spectrum which is obtained by applying a preparation pulse or pulse sequence, sampling the resulting free induction decay signals with a sequence having two evolution periods and a detection period to obtain data S ($t_1$, $t_2$, $t_3$), and taking the Fourier transform of the data to create the three-dimensional NMR spectrum $\alpha$ ($\omega_1$, $\omega_2$, $\omega_3$). The 3D NMR spectrum is sliced perpendicularly to the frequency axis $\omega_3$. Data about the 3D NMR spectrum is arithmetically processed in such a way that peaks having no symmetrical partners at symmetrical positions determined also taking account of the direction of the frequency axis $\omega_3$ are found and erased to obtain a spectrum $\alpha_1(\omega_1, \omega_2, \omega_3)$. The data about this spectrum is arithmetically processed in such a way that peaks complementary to the peaks having no symmetrical partners in the sliced planes of the spectrum $\alpha_1(\omega_1, \omega_2, \omega_3)$ are added to obtain a symmetrized spectrum $\alpha_2(\omega_1, \omega_2, \omega_3)$.

2 Claims, 4 Drawing Sheets

METHOD OF ANALYZING 3D NMR SPECTRUM

FIELD OF THE INVENTION

The present invention relates to three-dimensional NMR spectroscopy and, more particularly, to a method of analyzing the three-dimensional spectrum for symmetrical peaks by first symmetrizing a three-dimensional NMR spectrum.

BACKGROUND OF THE INVENTION

In recent years, two-dimensional NMR has enjoyed wide acceptance. Two-dimensional NMR spectra are easy to analyze. Especially, the interaction between nuclear spins can be elucidated by two-dimensional NMR spectroscopy.

The prior art 2D NMR experiment is now described in detail by referring to FIG. 1, where a pulse sequence with two 90° pulses is used. A general process of measurement by 2D NMR spectroscopy consists of a preparation period preceding the first 90° pulse, an evolution period of $t_1$, and a detection period of $t_2$. The preparation period is necessary to maintain the nuclear spin magnetization in its appropriate initial condition. The preparation pulse, or the first 90° pulse, brings the magnetization into nonequilibrium state. This state is caused to evolve in the evolution period $t_1$. In the detection period $t_2$ subsequent to the application of the detection period, or the second 90° pulse, the resulting free induction decay signal is detected. The phase and the amplitude of this decay signal reflect the behavior of the magnetization taken in the evolution period $t_1$. The period $t_1$ is varied so as to assume n discrete values. The free induction decay signal is detected at each of the n values. As a result, a set of data S ($t_1$, $t_2$) is obtained from n free induction decay signals. The obtained data includes information about the behavior of the magnetization in the evolution period $t_1$, as well as information about the behavior of the magnetization in the detection period $t_2$. Data about a 2D NMR spectrum $\alpha(\omega_1, \omega_2)$ is derived by taking the 2D Fourier transform of the data S ($t_1$, $t_2$) with respect to $t_2$ and $t_1$. FIG. 2 is one example of this 2D NMR spectrum, and in which the spectrum is plotted on the $\omega_1$-$\omega_2$ plane. In 2D NMR spectra, diagonal peaks and cross-peaks appear symmetrically. The relations between the peaks can be known from the symmetrical peaks.

If numerous superimposed peaks appear in a 2D NMR spectrum, it is difficult to understand which of the peaks are coupled to each other. Accordingly, 3D NMR has been proposed which separates the superimposed peaks and permits one to understand them.

FIG. 3 shows a simplest pulse sequence used in 3D NMR spectroscopy. This pulse sequence consists of three 90° pulses. A preparation period, a first evolution period of $t_1$, a second evolution period of $t_2$, and a detection period of $t_3$ are separated by the three pulses.

The first evolution period $t_1$ is varied so as to take n discrete values. The second evolution period $t_2$ is changed so as to assume m discrete values. As a result, n×m free induction decay signals are produced, and all of them are detected. Thus, a set of data S ($t_1$, $t_2$, $t_3$) is derived from the n×m free induction decay signals. The data includes information about the behavior of the magnetization in the period $t_3$. In addition, the data includes information about the behavior of the magnetization in the periods $t_1$ and $t_3$. A three-dimensional NMR spectrum $\alpha$ ($\omega_1$, $\omega_2$, $\omega_3$) having three frequency parameters $\omega_1$, $\omega_2$, $\omega_3$ is obtained by taking the three-dimensional Fourier transform of the data S ($t_1$, $t_2$, $t_3$) with respect to $t_3$, $t_2$, $t_1$. In this case, $\omega_1$, $\omega_2$ and $\omega_3$ vary in the same domain. However, in one of the most useful 3D experiments as shown in FIG. 9, $\omega_1$ and $\omega_2$ vary in the same domain and $\omega_3$ varies in another domain. 3D experiments developed from homonuclear 2D experiments by adding a dimension of another kind of nucleus belong to this class. Homonuclear 2D spectra are symmetrical and 3D spectra also have this property.

If this 3D NMR spectrum is sliced ($\alpha(\omega_1, \omega_2, \omega_3)$) at right angles to the frequency axis $\omega_3$ at a certain value of $\omega_3$, for example $\omega_3=\omega_{30}$, then one 2D NMR spectrum is obtained. This 2D NMR spectrum differs greatly in symmetry from 2D NMR spectra obtained by ordinary 2D NMR spectroscopy. In particular, a 2D NMR spectrum obtained by 2D NMR spectroscopy is essentially symmetrical, i.e., $\alpha(\omega_1, \omega_2)=\alpha(\omega_2, \omega_1)$. However, this equation does not hold for a 2D NMR spectrum derived by slicing a 3D NMR spectrum.

More specifically, two nuclear spins interact with each other if they are chemically directly coupled to each other or if they are close to each other. As an example, as shown in FIG. 4(a), we now discuss the case in which protons $^1H$ are spatially close to each other and chemically coupled to $^{15}N$. Let $\delta_1$, $\delta_2$, $\delta_3$, and $\delta_4$ be the chemical shifts of these four nuclear spins $^1H$ and $^{15}N$. Since couplings A and B are symmetrical, the corresponding peaks in the 2D NMR spectrum appear symmetrically. However, the chemical shift caused by $^1H$ differs from $\delta_3$ and $\delta_4$. In a 3D NMR spectrum in which these chemical shifts can be distinguished, a pair of symmetrical peaks appear in different sliced planes that are shifted along the frequency axis $\omega_3$. In each sliced plane, or in each 2D NMR spectrum, the spectrum is asymmetrical. Therefore, in order to search sliced planes for symmetrical peaks, sliced planes or 2D NMR spectra which differ in $\omega_3$ must be scrutinized one after another. It is very cumbersome and time-consuming to perform this work.

As shown in FIG. 4(b), where carbon nucleus C is coupled to proton $^1H$ causing chemical shift $\delta_1$, coupling B has no symmetrical partner. For this reason, in a 3D NMR spectrum, only a peak corresponding to coupling B appears; any peak forming a symmetrical partner does not appear. In this way, information that is useful for making analysis, based on symmetrical peaks in a 3D NMR spectrum, is not contained in those peaks which have no symmetrical partners. Rather, such peaks complicate spectra and can be said to be harmful.

SUMMARY OF THE INVENTION

It is an object of the present invention to provide a method of easily and quickly searching a three-dimensional NMR spectrum for symmetrical peaks by symmetrizing the spectrum in such a way that symmetrical peaks appear in the same sliced plane at all times.

It is another object of the invention to provide a method of easily and quickly searching the spectrum for the symmetrical peaks by symmetrizing the spectrum in such a way that peaks having no symmetrical partners are removed.

The above objects are achieved by method of symmetrizing a three-dimensional NMR spectrum $\alpha(\omega_1, \omega_2, \omega_3)$ which is obtained by applying a preparation pulse or pulse sequence, sampling the resulting free induction decay signals with a sequence having two evolution periods and a detection period to obtain data S ($t_1$, $t_2$, $t_3$), and taking the Fourier transform of the data to create the three-dimensional NMR spectrum $a(\omega_1, \omega_2, \omega_3)$, said method comprising the steps of: slicing the three-dimensional NMR spectrum perpendicularly to the frequency axis $\omega_3$; arithmetically processing data about the three-dimensional NMR spectrum in such a way that peaks having no symmetrical partners at symmetrical positions determined, also taking account of the direction of the frequency axis $\omega_3$, are found and erased to obtain a spectrum $a_1(\omega_1, \omega_2, \omega_3)$; adding peaks complementary to the peaks each existing alone in each sliced plane of the spectrum $a_1(\omega_1, \omega_2, \omega_3)$ to obtain a symmetrized spectrum $a_2(\omega_1, \omega_2, \omega_3)$.

Other objects and features of the invention will appear in the course of the description thereof which follows.

DETAILED DESCRIPTION OF THE PREFERRED EMBODIMENT

Figure 5:
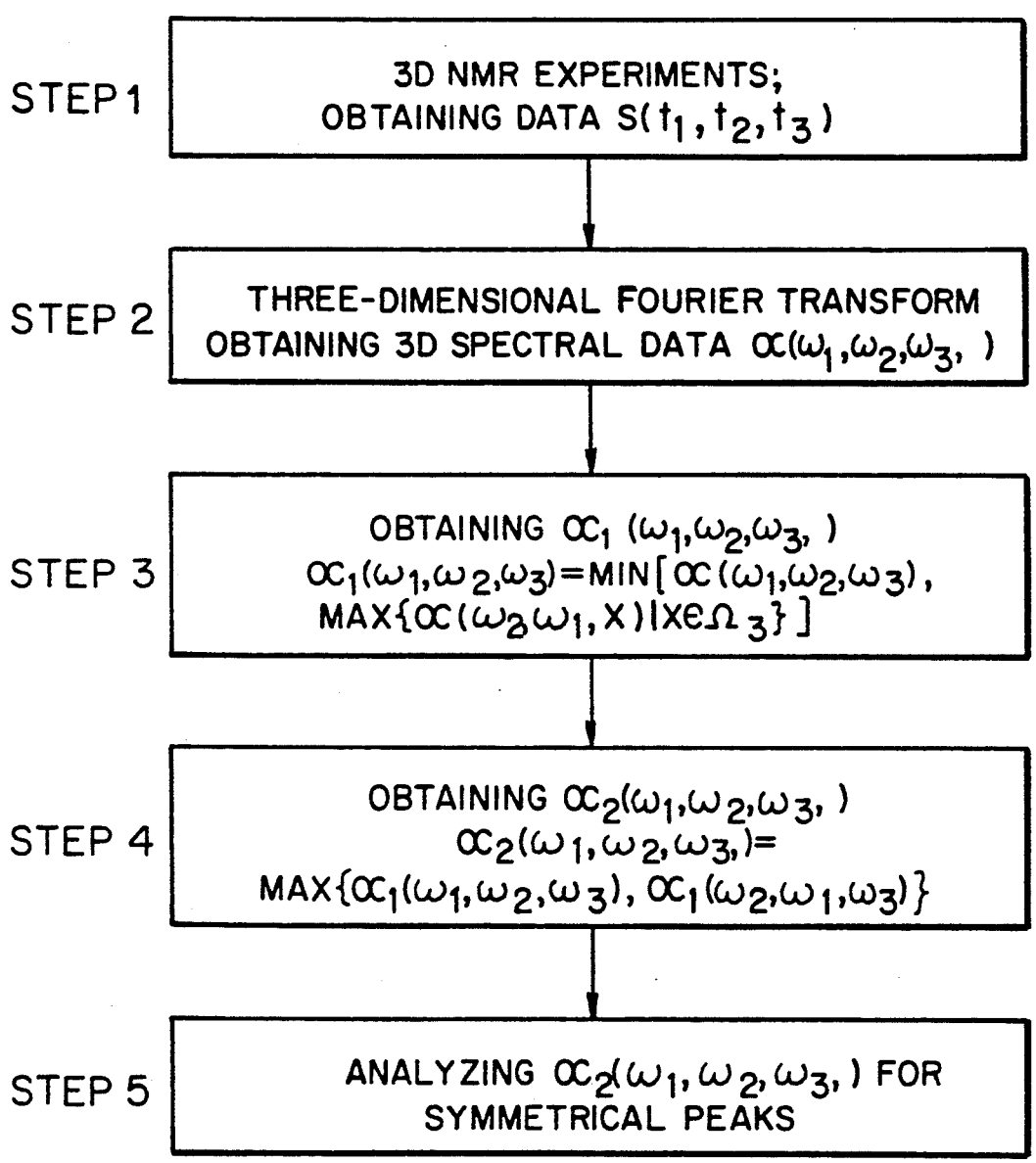
FIG. 5 is a flowchart illustrating a sequence in which the novel method is carried out.

FIG. 5 is a flowchart illustrating the fundamental procedure for analyzing a three-dimensional NMR spectrum for symmetrical peaks by symmetrizing a three-dimensional NMR spectrum in accordance with this invention. We now express data about the 3D NMR spectrum by means of $a(\omega_1, \omega_2, \omega_3)$; where $a$ is a real function; and $\omega_1, \omega_2, \omega_3$ are real numbers. It is assumed that $\omega_1$ and $\omega_2$ have the same domain. It is also assumed that some peaks are scattered in the 3D NMR spectrum and that these peaks are given by delta function $\delta$.

At step 1, 3D NMR experiments are made, and data S ($t_1$, $t_2$, $t_3$) is obtained.

Figure 6:
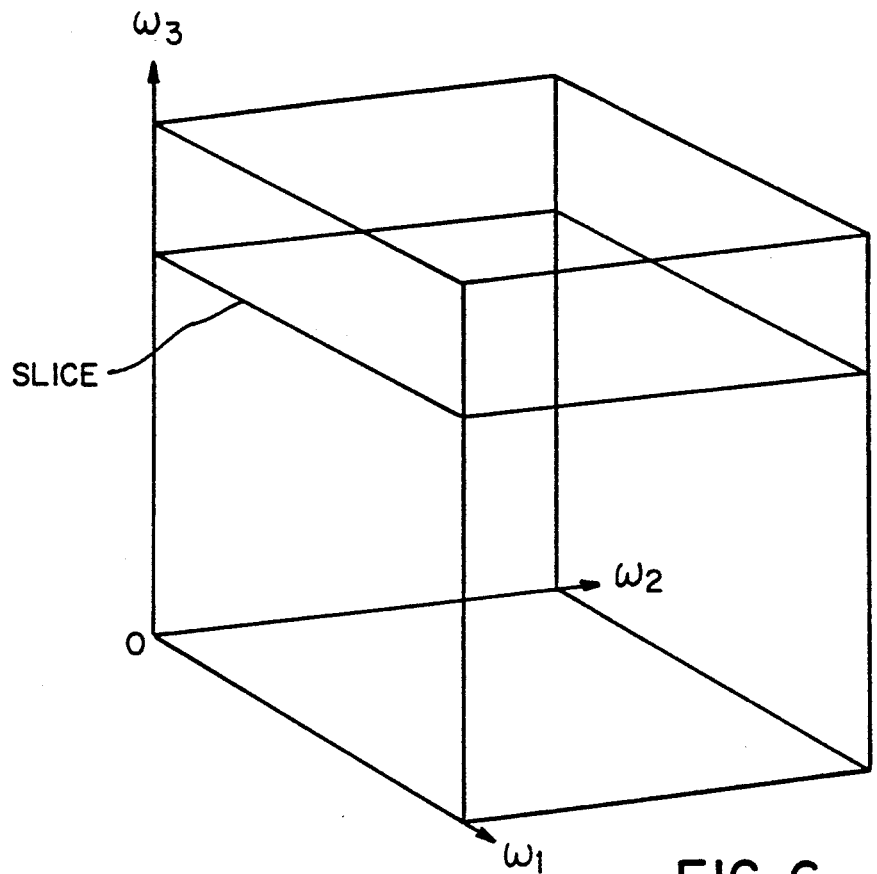
FIG. 6 is a visual representation of data about a three-dimensional NMR spectrum.

At step 2, data about a three-dimensional NMR spectrum $a(\omega_1, \omega_2, \omega_3)$ consisting of three frequency parameters $\omega_1, \omega_2, \omega_3$ is obtained by taking the three-dimensional Fourier transform of the data S ($t_1$, $t_2$, $t_3$) with respect to $t_3$, $t_2$, $t_1$. A visual representation of the data $a(\omega_1, \omega_2, \omega_3)$ is shown in FIG. 6.

At step 3, the obtained data $a(\omega_1, \omega_2, \omega_3)$ is arithmetically processed, using max function and min function given by equation (1), to produce data about a spectrum $a_1(\omega_1, \omega_2, \omega_3)$ from which all the peaks having no symmetrical partners have been removed.

$$a_1(\omega_1, \omega_2, \omega_3) = \min\,[a(\omega_1, \omega_2, \omega_3), \max\,\{a(\omega_2, \omega_1, X)|X\epsilon\Omega_3\}] \quad (1)$$

where $\Omega_3$ is the domain of the frequency $\omega_3$.

Figure 7:
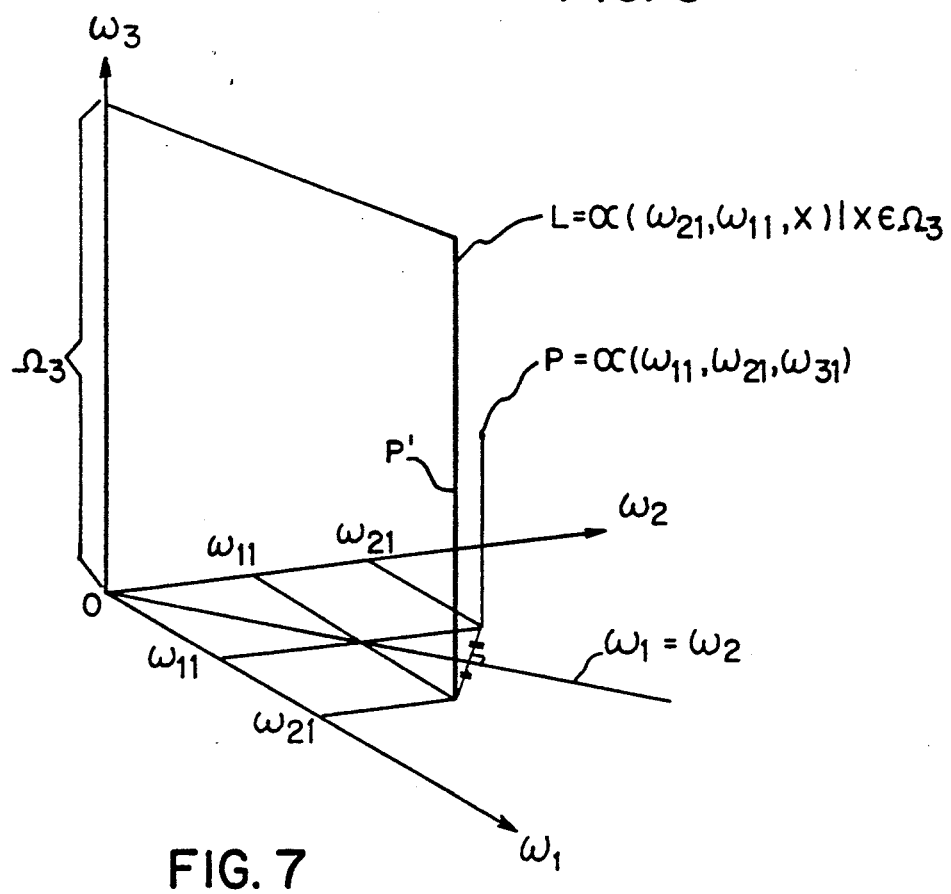
FIG. 7 is a diagram showing the relation of $a(\omega_{11}, \omega_{21}, \omega_{31})$ to $a(\omega_{21}, \omega_{11}, X)|X\epsilon\Omega_3$ when arbitrary values $\omega_{11}, \omega_{21}, \omega_{31}$ are substituted into $\omega_1, \omega_2, \omega_3$, respectively.

FIG. 7 shows the relation of $a(\omega_{11}, \omega_{21}, \omega_{31})$ to $a(\omega_{21}, \omega_{11}, X)|X\epsilon\Omega_3$ when arbitrary values $\omega_{11}, \omega_{21}, \omega_{31}$ are substituted into $\omega_1, \omega_2, \omega_3$, respectively. In FIG. 7, point P is given by $a(\omega_{11}, \omega_{21}, \omega_{31})$. Point P and P' are symmetrical with respect to the central plane $\omega_1 = \omega_2$. A straight line L which passes through the point P' and runs parallel to the axis $\omega_3$ is given by $a(\omega_{21}, \omega_{11}, X)|X\epsilon\Omega_3$.

Function max $\{a(\omega_{21}, \omega_{11}, X)|X\epsilon\Omega_3\}$ is used to find the maximum value of the straight line L. If any peak exists on the line L, the value of the function max $\{a(\omega_{21}, \omega_{11}, X)|X\epsilon\Omega_3\}$ is the intensity of the peak. If no peaks exist, the value of the function max $\{a(\omega_{21}, \omega_{11}, X)|X\epsilon\Omega_3\}$ is zero.

Equation (1) means that the smaller one of the values of the function max $\{a(\omega_{21}, \omega_{11}, X)|X\epsilon\Omega_3\}$ and the value of $a(\omega_{11}, \omega_{21}, \omega_{31})$ is left and taken as $a_1(\omega_{11}, \omega_{21}, \omega_{31})$. Therefore, if no peaks are present on the line L, then the relation $a_1(\omega_{11}, \omega_{21}, \omega_{31}) = 0$ holds. In summary, by performing the processing given by equation (1), data about a new spectrum $a_1(\omega_1, \omega_2, \omega_3)$ is obtained. In this new spectrum, those peaks which have no symmetrical partners have been erased.

At step 4, The obtained data $a_1(\omega_1, \omega_2, \omega_3)$ is arithmetically processed, using max function given by equation (2), to give rise to data $a_2(\omega_1, \omega_2, \omega_3)$.

$$a_2(\omega_1, \omega_2, \omega_3) = \max\,\{a_1(\omega_1, \omega_2, \omega_3), a_1(\omega_2, \omega_1, \omega_3)\} \quad (2)$$

In this processing, in each 2D NMR spectrum given by a sliced plane vertical to the axis $\omega_3$, data $a_1(\omega_1, \omega_2, \omega_3)$ is compared with the data $a_1(\omega_2, \omega_1, \omega_3)$ at the symmetrical position. The strength of the larger data is taken as $a_2(\omega_1, \omega_2, \omega_3)$. The relation $a_2(\omega_1, \omega_2, \omega_3) = c$ holds, as long as $a_1(\omega_2, \omega_1, \omega_3) = c$ ($c \neq 0$) holds, even if $a_1(\omega_1, \omega_2, \omega_3) = 0$. If any peak has no symmetrical partner on the opposite side of the axis of symmetry ($\omega_1 = \omega_2$) in each 2D spectrum, the symmetrical peak of the same strength is supplemented by this processing.

At step 5, the obtained data $a_2(\omega_1, \omega_2, \omega_3)$ represent a 3D NMR spectrum in which peaks having no symmetrical partners have been removed by the processing given by equation (1). In addition, in each individual 2D NMR spectrum constituting the 3D NMR spectrum, symmetrical partners are complemented. These two sets of processing given by equations (1) and (2) are next described in further detail.

Figure 1:
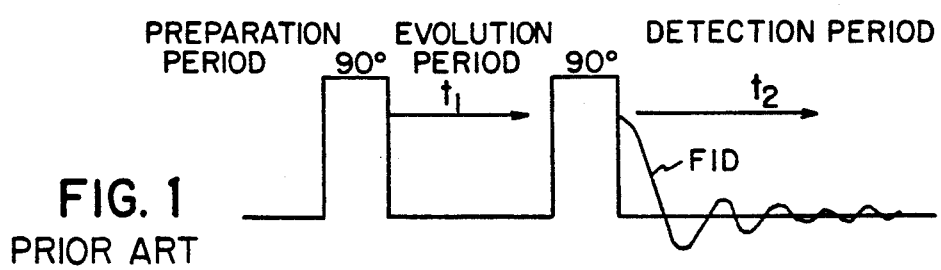
FIG. 1 is a diagram showing a fundamental pulse sequence used for two-dimensional NMR spectroscopy.
Figure 2:
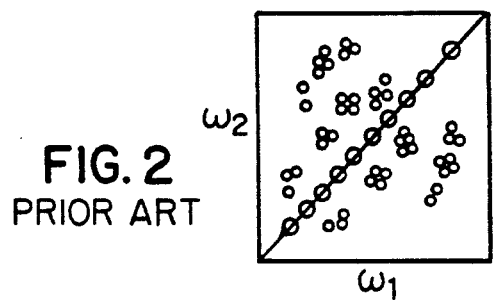
FIG. 2 is a two-dimensional NMR spectrum.
Figure 3:
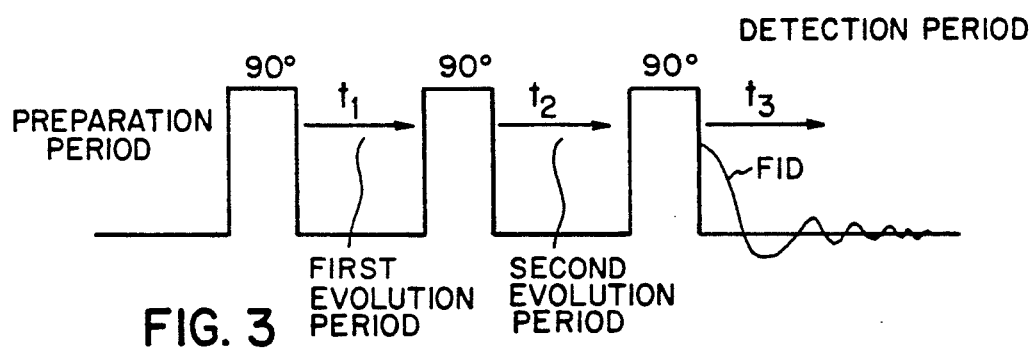
FIG. 3 is a diagram showing a fundamental pulse sequence used for three-dimensional NMR spectroscopy.
Figure 4A:
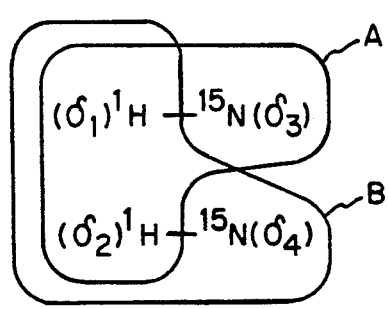
FIGS. 4(a) and 4(b) are diagrams showing couplings of protons $^1H$ to $^{15}N$.
Figure 4B:
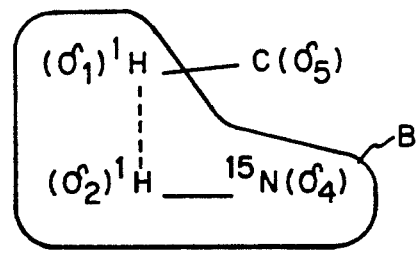
Figure 8:
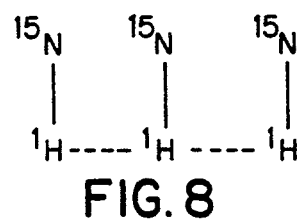
FIG. 8 is a diagram shown in the chemical structure of a sample that is a protein labeled with $^{15}N$.

We now discuss a sample consisting of a protein labeled with $^{15}N$. As shown in FIG. 8, this sample has long peptide chains. Adjacent protons $^1H$ are spatially close to each other. Protons $^1H$ are chemically coupled to nitrogen atoms $^{15}N$.

Figure 9:
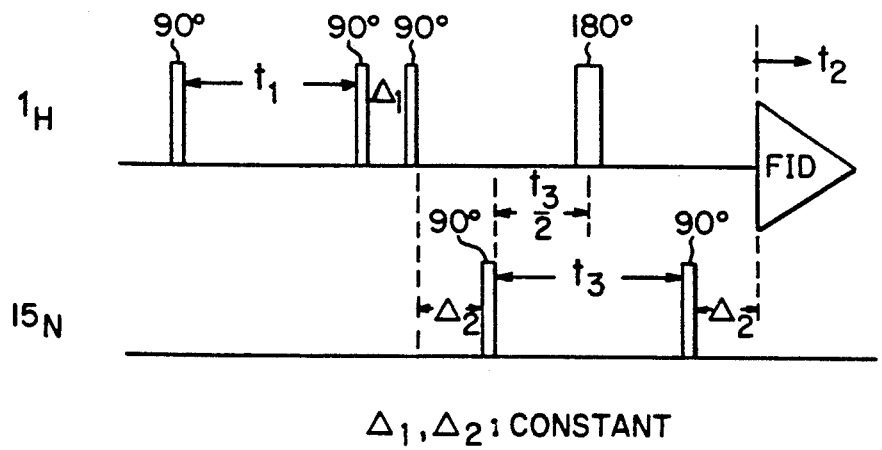
FIG. 9 is a diagram of a pulse sequence used for three-dimensional NMR experiments.
Figure 10:
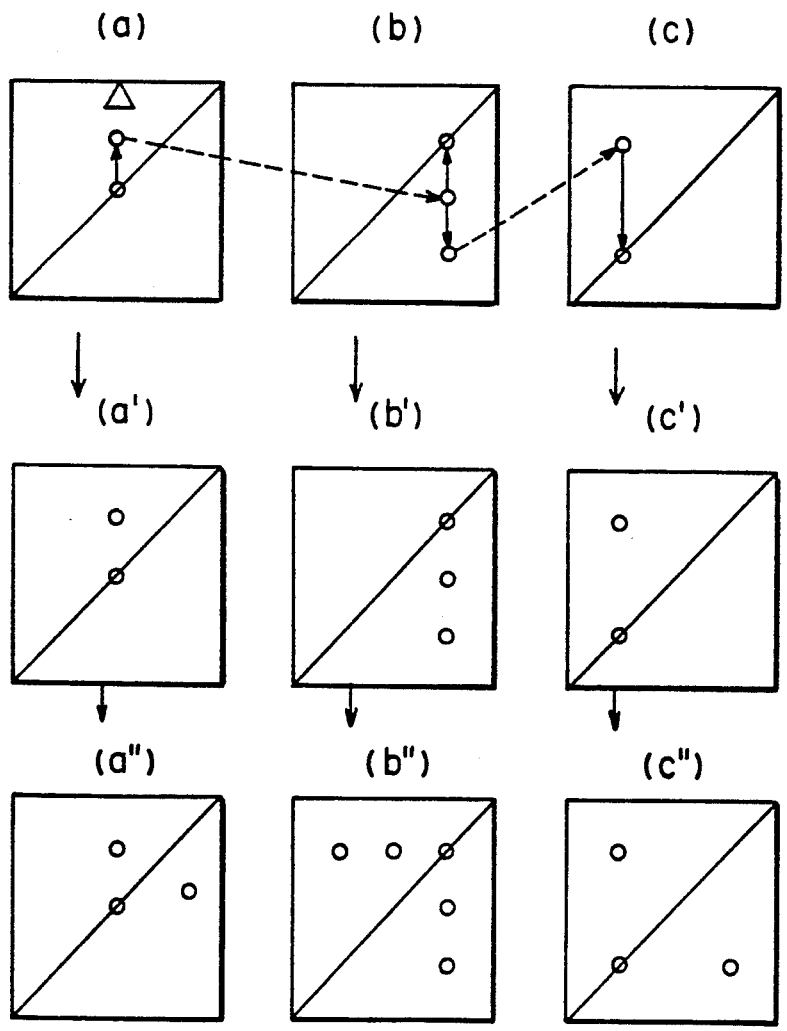
FIG. 10 shows changes in a three-dimensional NMR spectrum processed in accordance with the invention, and analyzing the symmetrized spectrum $a_2(\omega_1, \omega_2, \omega_3)$ for symmetrical peaks.

Three-dimensional NMR experiments are made on this sample with a pulse sequence as shown in FIG. 9. These 3D NMR experiments are a combination of 2D NOESY experiments for collecting information regarding the correlation of adjacent protons $^1H$ and 2D HMQC experiments for collecting information regarding chemical coupling between protons $^1H$ and nitrogen atoms $^{15}N$.

Where the sample consists of three peptide chains as shown in FIG. 8, a 3D NMR spectrum having three sliced planes as shown in FIG. 10 (a), (b), (c) is obtained. Two-dimensional NMR spectra appear on these sliced planes which are perpendicular to the frequency axis $\omega_3$. In the past, it has been known that three peaks arising from $^{15}$N-$^1$H coupling are associated, by tracing symmetrical peaks along the broken lines from FIG. 10 (a). As already described, observation of numerous sliced planes along the axis $\omega_3$ is needed for this purpose. Furthermore, in order to know that a peak indicated by $\Delta$ in FIG. 10 (a) has no symmetrical partner, all other sliced planes must be checked.

On the other hand, in accordance with the present invention, spectra shown in FIG. 10 (a), (b), (c) are changed into spectra shown in FIG. 10 (a'), (b'), (c'), respectively, by the processing given by equation (1). It can be seen that the peak existing alone in FIG. 10 (a) has disappeared in FIG. 10 (a'). Spectra shown in FIG. 10 (a'), (b'), (c') are changed into spectra shown in FIG. 10 (a''), (b''), (c''), respectively, by the processing given by equation (2). It can be seen that symmetrical partners are complemented on the opposite side of the axis of symmetry in the sliced planes shown in FIG. 10 (a''), (b''), (c'').

Where no complementary peaks exist as shown in FIG. 10 (a), (b), (c), one must search for the symmetrical peaks while estimating symmetrical locations. In accordance with the invention, it is only necessary to search other sliced planes for peaks which coincide in position with the complemented peaks. Hence, it is easy to search the other sliced planes for the symmetrical peaks precisely. In this case, vertical alignment of the proper peaks with the complemented peaks can be known by drawing the spectra carried by the sliced planes on transparent sheets, superimposing all the sheets, and watching the spectra from just or slantly above.

Having thus described our invention with the detail and particularity required by the Patent Laws, what is desired to be protected by Letters Patent is set forth in the following claims.

What is claimed is:

1. A three-dimensional NMR pulsed spectroscopy method comprising the steps for:

applying a preparation pulse or pulse sequence to a specimen, sampling the resulting free induction decay signals with a sequence having two evolution periods and a detection period to obtain data $S(t_1, t_2, t_3)$ wherein $t_1$ is the duration of of the first evolution period, $t_2$ is the duration of the second evolution period and $t_3$ is the time from the start of the detection period;

taking the Fourier transform of the data to create the three-dimensional NMR spectrum $\alpha(\omega_1, \omega_2, \omega_3)$;

slicing the three-dimensional NMR spectrum perpendicularly to the frequency axis $\omega_3$ to obtain a plurality of two-dimensional slice spectrums;

arithmetically processing data in each two-dimensional slice spectrum in such a way that peaks having no symmetrical partners at symmetrical positions in any two-dimensional slice spectrum are found and erased to obtain a new three-dimensional spectrum $\alpha_1(\omega_1, \omega_2, \omega_3)$;

adding peaks complementary to the peaks existing alone in each tow-dimensional slice spectrum to obtain a symmetrized three-dimensional spectrum $\alpha_2(\omega_1, \omega_2, \omega_3)$; and reviewing the symmetrized spectrum for tracing symmetrical peaks indicative of specimen structure.

2. A three-dimensional NMR pulsed spectroscopy method comprising the steps for:

applying a preparation pulse or pulse sequence to a specimen;

sampling the resulting free induction decay signals with a sequence having two evolution periods and a detection period to obtain data $S(t_1, t_2, t_3)$ wherein $t_1$ is the duration of the first evolution period, $t_2$ is the duration of the second evolution period and $t_3$ is the time from the start of the detection period;

taking the Fourier transform of the data to create the three-dimensional NMR spectrum $\alpha(\omega_1, \omega_2, \omega_3)$;

slicing the three-dimensional NMR spectrum perpendicularly to the frequency axis $\omega_3$ to obtain a plurality of two-dimensional slice spectrums;

arithmetically processing data in each two-dimensional slice spectrum according to the equation given by $$\alpha_1(\omega_1, \omega_2, \omega_3) = \min [\alpha(\omega_1, \omega_2, \omega_3), \max \{\alpha(\omega_2, \omega_1, X) | X \epsilon \Omega_3\}]$$

to obtain a spectrum $\alpha_1(\omega_1, \omega_2, \omega_3)$, where $\Omega_3$ is the domain of frequency $\omega_3$;

arithmetically processing data in each two-dimensional slice spectrum according to the equation given by $$\alpha_2(\omega_1, \omega_2, \omega_3) = \max \{\alpha_1(\omega_1, \omega_2, \omega_3), \alpha_1(\omega_2, \omega_1, \omega_3)\}$$

to obtain a symmetrized three-dimensional spectrum $\alpha_2(\omega_1, \omega_2, \omega_3)$; and reviewing the symmetrized spectrum for tracing symmetrical peaks indicative of specimen structure.

* * * * *

UNITED STATES PATENT AND TRADEMARK OFFICE
CERTIFICATE OF CORRECTION

PATENT NO. : 5,168,225
DATED : December 1, 1992
INVENTOR(S) : Toshio Yamazaki and Kuniaki Nagayama It is certified that error appears in the above-identified patent and that said Letters Patent is hereby corrected as shown below:

Claim 1 Line 13 Column 6 "tow" should read --two--.

Signed and Sealed this

Fifteenth Day of February, 1994

*Attest:*

BRUCE LEHMAN

*Attesting Officer*                *Commissioner of Patents and Trademarks*